(12) United States Patent
Arisumi et al.

(10) Patent No.: US 7,473,565 B2
(45) Date of Patent: Jan. 6, 2009

(54) SEMICONDUCTOR DEVICE AND METHOD OF MANUFACTURING THE SAME

(75) Inventors: Osamu Arisumi, Tokyo (JP); Keitaro Imai, Tokyo (JP); Koji Yamakawa, Tokyo (JP); Bum-ki Moon, Tokyo (JP)

(73) Assignees: Kabushiki Kaisha Toshiba, Tokyo (JP); Infineon Technologies AG, Munich (DE)

( * ) Notice: Subject to any disclaimer, the term of this patent is extended or adjusted under 35 U.S.C. 154(b) by 25 days.

(21) Appl. No.: 11/177,281

(22) Filed: Jul. 11, 2005

(65) Prior Publication Data

US 2005/0245023 A1    Nov. 3, 2005

Related U.S. Application Data

(60) Division of application No. 10/760,499, filed on Jan. 21, 2004, now Pat. No. 6,924,521, which is a continuation of application No. PCT/JP03/06671, filed on May 28, 2003.

(30) Foreign Application Priority Data

May 28, 2002  (JP) .............................. 2002-154585

(51) Int. Cl.
    *H01L 21/00* (2006.01)
(52) U.S. Cl. .................................. 438/3; 257/E21.663
(58) Field of Classification Search .................. 438/3, 438/663, 238; 257/E21.663, E29.164
    See application file for complete search history.

(56) References Cited

U.S. PATENT DOCUMENTS

| | | | | |
|---|---|---|---|---|
| 5,635,420 | A * | 6/1997 | Nishioka | 438/3 |
| 6,115,281 | A * | 9/2000 | Aggarwal et al. | 365/145 |
| 6,165,802 | A * | 12/2000 | Cuchiaro et al. | 438/3 |
| 6,265,230 | B1 * | 7/2001 | Aggarwal et al. | 438/3 |
| 6,274,454 | B1 * | 8/2001 | Katori | 438/396 |
| 6,287,637 | B1 | 9/2001 | Chu et al. | |
| 6,440,754 | B2 * | 8/2002 | Hayashi et al. | 438/3 |
| 6,475,854 | B2 * | 11/2002 | Narwankar et al. | 438/238 |
| 6,485,988 | B2 * | 11/2002 | Ma et al. | 438/3 |
| 6,495,872 | B2 | 12/2002 | Nakamura | |
| 6,610,548 | B1 * | 8/2003 | Ami et al. | 438/3 |
| 6,744,087 | B2 * | 6/2004 | Misewich et al. | 257/295 |
| 6,924,521 | B2 * | 8/2005 | Arisumi et al. | 257/295 |
| 7,368,298 | B2 * | 5/2008 | Wang | 438/3 |
| 2001/0002273 | A1 * | 5/2001 | Joshi et al. | 427/62 |
| 2001/0014482 | A1 * | 8/2001 | Agarwal et al. | 438/2 |
| 2002/0074601 | A1 * | 6/2002 | Fox et al. | 257/350 |
| 2002/0177273 | A1 * | 11/2002 | Lee et al. | 438/240 |

FOREIGN PATENT DOCUMENTS

| | | |
|---|---|---|
| EP | 0 821 415 | 1/1998 |
| JP | 5-347391 | 12/1993 |
| JP | 8-17939 | 1/1996 |

(Continued)

*Primary Examiner*—Thao P. Le
(74) *Attorney, Agent, or Firm*—Oblon, Spivak, McClelland, Maier & Neustadt, P.C.

(57) ABSTRACT

A semiconductor device comprises a bottom electrode, a top electrode, and a dielectric film provided between the bottom electrode and the top electrode and made of a perovskite type ferroelectrics containing Pb, Zr, Ti and O, the dielectric film comprising a first portion formed of a plurality of crystal grains partitioned by grain boundaries having a plurality of directions.

4 Claims, 5 Drawing Sheets

FOREIGN PATENT DOCUMENTS

| | | |
|---|---|---|
| JP | 10-50960 | 2/1998 |
| JP | 11-126877 | 5/1999 |
| JP | 2000-156473 | 6/2000 |
| JP | 2000-340761 | 12/2000 |
| JP | 2003-142657 | 5/2003 |
| KR | 1998-0012466 | 4/1998 |

\* cited by examiner

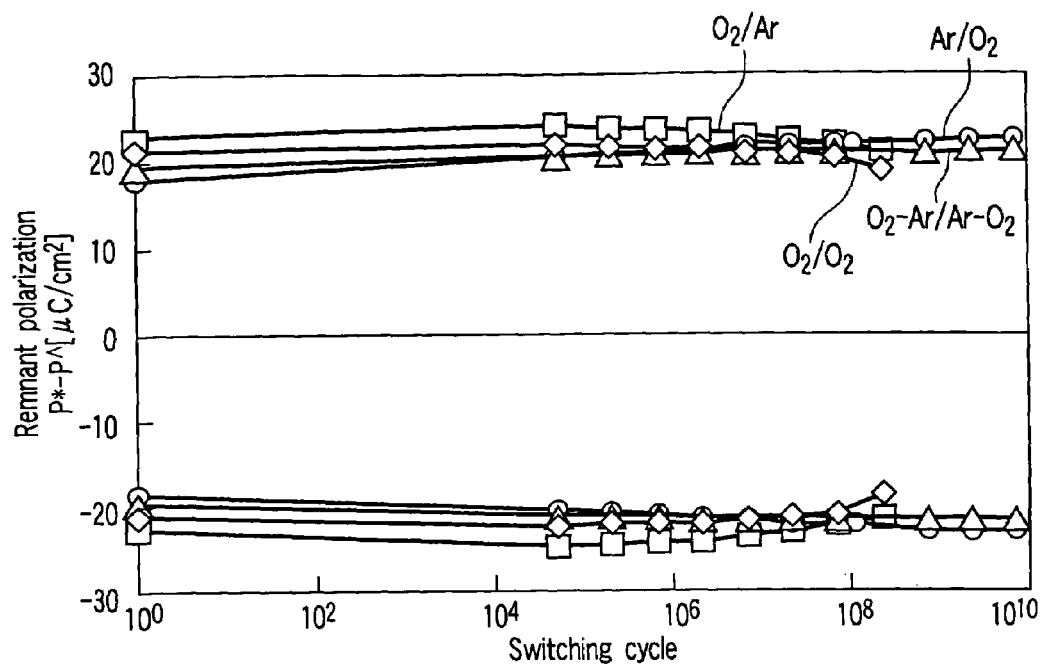
F I G. 10
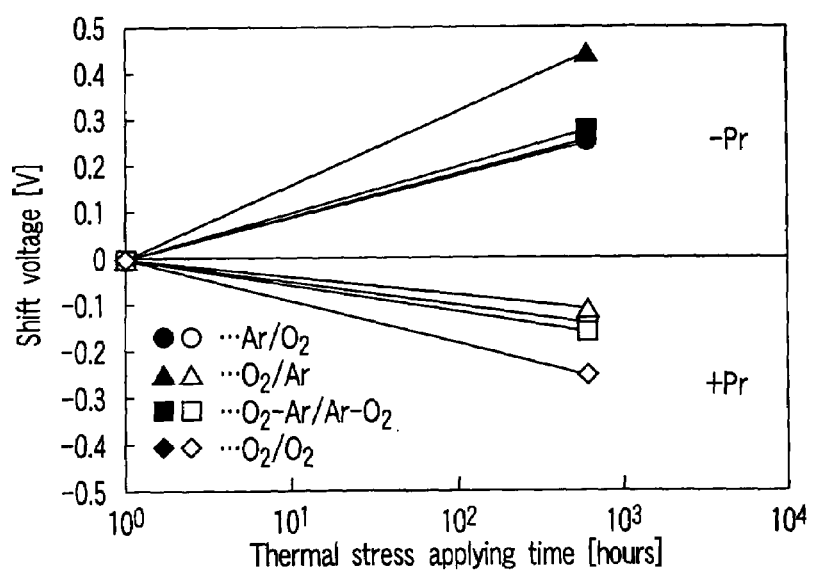
F I G. 11

US 7,473,565 B2

SEMICONDUCTOR DEVICE AND METHOD OF MANUFACTURING THE SAME

CROSS-REFERENCE TO RELATED APPLICATIONS

This application is based upon and claims the benefit of priority under 35 U.S.C. § 120 from U.S. application Ser. No. 10/760,499, filed Jan. 21, 2004, which is a Continuation Application of PCT Application No. PCT/JP03/06671, filed May 28, 2003, which was not published under PCT Article 21 (2) in English, and under 35 U.S.C. § 119 from the prior Japanese Patent Application No. 2002-154585, filed May 28, 2002, the entire contents of which are incorporated herein by reference.

BACKGROUND OF THE INVENTION

1. Field of the Invention

The present invention relates to a semiconductor device and a method of manufacturing the same, particularly, to a semiconductor device comprising a capacitor using a ferroelectric material and a method of manufacturing the same.

2. Description of the Related Art

In recent years, the field of application of an LSI (large scale integrated circuit) is being expanded greatly. Specifically, the LSI was applied mainly in the past to, for example, a supercomputer, an EWS (Engineering Workstations) and a personal computer. However, the LSI is being mainly applied nowadays to, for example, a mobile apparatus and a multimedia system. As a result, it is important nowadays to impart a nonvolatile function to the LSI, in addition to low power consumption and high-speed operation. Also, it is important to introduce a new material into the LSI in order to impart a higher performance and more multi-functions to the LSI.

For example, a ferroelectric memory (ferroelectric RAM) with non volatility using a ferroelectric film, such as a film of a perovskite material or a film of a bismuth layered material, as an dielectric film of a capacitor for storing information attracts great attention recently. The ferroelectric memory, which can be substituted for a flash memory, an SRAM (Static RAM), and a DRAM (Dynamic RAM) and which can be applied to a logic circuit embedded device, has high expectations as a next-generation memory. Also, since the ferroelectric memory can be operated at high speed without using a battery, the ferroelectric memory has come to be used in a non-contact card such as an RF-ID (Radio Frequency-Identification).

The materials used for preparing a ferroelectric memory include highly volatile elements or elements which are diffused in the manufacturing process, and these react with other materials. As a result, the manufacturing process is greatly affected by the materials used for preparing ferroelectric memories.

A PZT film, i.e., $Pb(Zr, Ti)O_3$ film, is one of the most typical composite oxides used as a ferroelectric film. Lead (Pb) contained in the PZT film has a higher vapor pressure than that of other elements contained in the PZT film. Therefore, a method, in which an amorphous film is formed first at a low temperature, followed by applying a heat treatment at a high temperature to the amorphous film so as to convert the amorphous film into a crystalline film, is generally employed for forming a PZT film. For example, widely employed is a method, in which an amorphous PZT film is formed first at room temperature by employing, for example, a sputtering method, followed by applying an RTA (Rapid Thermal Annealing) treatment to the amorphous PZT film in the oxygen atmosphere so as to instantly crystallize the amorphous PZT film.

However, since it is difficult to control the Pb amount throughout the manufacturing process, it is very difficult to manufacture a semiconductor device with a high accurate repeatability at a high yield. It should also be noted that, in order to improve the reliability of the semiconductor device, an oxide such as $IrO_2$, $RuO_2$, SRO ($SrRuO_3$), or LSCO (($La, Sr)CoO_3$) is used for forming the electrodes of the capacitor. What should be noted is that these elements contained in the electrode material are diffused into the PZT film and react with Pb in grain boundary, resulting in degradation of I-V characteristics and poor ferroelectric property.

Further, the amorphous PZT film was annealed in oxygen ambient in the case of conventional crystallization. Hence, the crystals of the PZT film were exhibited a columnar structure as described herein later, resulting in the high leakage current and deterioration of switching endurance.

The use of a PZT film is referred to in, for example, Jpn. Pat. Appln. KOKAI Publication No. 2000-156473 and U.S. Pat. No. 6,287,637B1. Each of these publications teaches that a PZT film formed first is annealed in an Ar gas atmosphere, followed by further annealing the PZT film in an oxygen gas atmosphere. However, the structure of the PZT film after the annealing treatment is not considered in each of these publications. Generally, it was difficult to obtain a ferroelectric capacitor excellent in the leakage characteristics.

As described above, the leakage current was increased and the fatigue property was degraded in the conventional ferroelectric capacitor, which make it difficult to obtain a capacitor excellent in I-V characteristics and reliability. Generally, it is of high importance to develop a semiconductor device comprising a capacitor of excellent characteristics and reliability, and a method of manufacturing the semiconductor device.

BRIEF SUMMARY OF THE INVENTION

According to a first aspect of the present invention, there is provided a semiconductor device comprising: a bottom electrode; a top electrode; and a dielectric film provided between the bottom electrode and the top electrode and made of a perovskite type ferroelectrics containing Pb, Zr, Ti and O, the dielectric film comprising a first portion formed of a plurality of crystal grains partitioned by grain boundaries having a plurality of directions.

According to a second aspect of the present invention, there is provided a method of manufacturing a semiconductor device, comprising: forming on a bottom electrode a dielectric film made of a perovskite type ferroelectrics containing Pb, Zr, Ti and O; and forming a top electrode on the dielectric film, forming the dielectric film comprising: forming a first portion of the dielectric film on the bottom electrode by an annealing in an oxygen gas atmosphere; and forming a second portion of the dielectric film on the first portion by an annealing in an inert gas atmosphere.

BRIEF DESCRIPTION OF THE SEVERAL VIEWS OF THE DRAWING

FIG. 10 shows the result of the measurement in respect of the fatigue property of a capacitor;

FIG. 11 shows the result of the measurement in respect of the imprint characteristics of a capacitor;

DETAILED DESCRIPTION OF THE INVENTION

Some embodiments of the present invention will now be described with reference to the accompanying drawings.

First Embodiment

Figure 1:
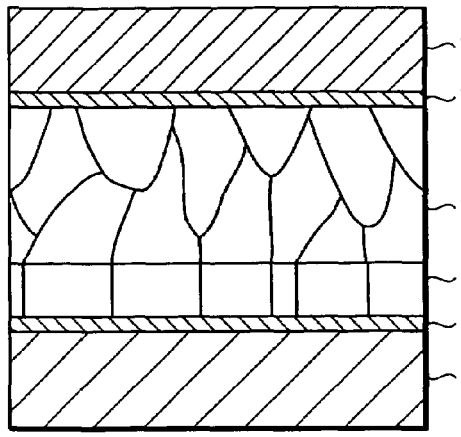
FIG. 1 is a cross sectional view schematically showing the structure of a capacitor according to a first embodiment of the present invention.

FIG. 1 schematically shows the structure of a capacitor in a semiconductor device according to a first embodiment of the present invention.

The capacitor shown in FIG. 1 is formed above a semiconductor substrate (not shown), such as a silicon substrate, and is used as a capacitor for storing charges in a nonvolatile ferroelectric memory.

A method of manufacturing the capacitor shown in FIG. 1 will now be described.

In the first step, a Pt film 11 is formed to a thickness of 100 nm by a DC magnetron sputtering method on an underlying film, such as an LP-TEOS oxide film. The sputtering treatment for forming the Pt film 11 is performed in an Ar gas atmosphere for 20 seconds with the input power set at 3 kW. Then, an $SrRuO_3$ film (SRO film) 12 is formed by a DC magnetron sputtering method at room temperature. The sputtering treatment for forming the SRO film 12 is performed in an Ar gas atmosphere for 11.5 seconds with the input power set at 700 W. Then, a heat treatment is applied at 550° C. to 600° C. for 30 seconds in an oxygen gas atmosphere so as to crystallize the SRO film 12.

In the next step, a PZT film 13, i.e., a $Pb(Zr, Ti)O_3$ film, is formed on the SRO film 12. PZT is a perovskite type ferroelectric material represented by $ABO_3$ and consisting Pb, Zr, Ti and O at least. Lead (Pb) corresponds to the site A element, and Zr or Ti corresponds to the site B element. In some cases, a small amount of another element is substituted in the site A element or the site B element.

The step of forming the PZT film 13 will now be described. In the first step, an amorphous PZT film is deposited at room temperature on the SRO film 12 by an RF magnetron sputtering method, followed by applying a heat treatment to the amorphous PZT film at 550 to 600° C. for 30 seconds by an RTA treatment so as to crystallize the amorphous PZT film. Then, an additional amorphous PZT film is deposited on the crystallized PZT film, followed by applying an RTA treatment to the additional amorphous PZT film at 550 to 600° C. for 30 seconds so as to crystallize the additional amorphous PZT film. As a result, formed is a crystalline PZT film 13 having a total thickness of 130 nm. As described above, the deposition and annealing of the amorphous PZT film are repeated twice so as to decrease the surface roughness of the PZT film 13 and to make uniform the Pb distribution in the PZT film 13. Incidentally, a high density target having a composition of, for example, $(Pb_{1.15}, La_{0.03})(Zr_{0.4}, Ti_{0.6})O_3$ is used as the PZT target. Also, the deposition by the sputtering for forming each of the amorphous PZT films is performed in an Ar gas atmosphere for 72 seconds with the input power set at 1.5 kW.

The annealing step of the PZT film 13 will now be described in detail. Concerning the lower layer PZT film (lower portion of the PZT film), the annealing is performed in an oxygen gas atmosphere for the former 15 seconds after a temperature has reached the highest temperature of 550 to 600° C., and the annealing is performed in an Ar gas atmosphere for the latter 15 seconds. The switching from the oxygen gas to the Ar gas is carried out sequentially. On the other hand, concerning the upper layer PZT film (upper portion of the PZT film), the annealing is performed in an Ar gas atmosphere for the former 15 seconds after the temperature has reached 550 to 600° C., and the annealing is performed in an oxygen gas atmosphere for the latter 15 seconds. The switching from the Ar gas to the oxygen gas is carried out sequentially. A PZT film 13b is obtained mainly in the annealing step of the lower layer PZT film carried out in the oxygen gas atmosphere, and a PZT film 13a is obtained mainly in the subsequent steps.

In the next step, an SRO film 14 is formed to a thickness of 10 nm on the PZT film 13, followed by forming a Pt film 15 to a thickness of 50 nm on the SRO film 14. It should be noted that each of the SRO film 14 and the Pt film 15 is formed by using, for example, a shadow mask, and is a circular pattern having a diameter of 160 μm. Then, a heat treatment is performed by using an electric furnace at 550 to 600° C. for one hour in an oxygen gas atmosphere.

As described above, obtained is a capacitor structure comprising a bottom electrode including of the Pt film 11 and the SRO film 12, a top electrode including of the SRO film 14 and the Pt film 15, and a ferroelectric film of the PZT film 13 sandwiched between the bottom electrode and the top electrode referred to above.

Figure 2:
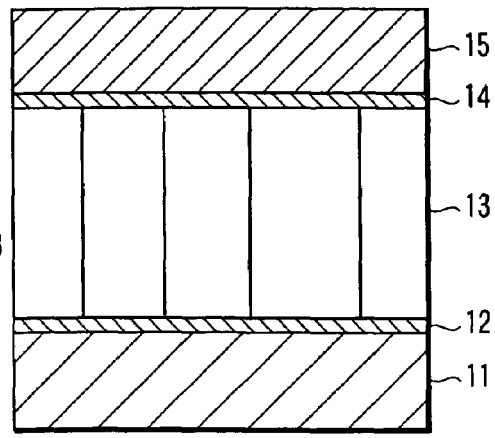
FIG. 2 is a cross sectional view schematically showing the structure of a capacitor for a comparative example (conventional case)

FIG. 2 schematically shows a capacitor structure for a comparative case. The Pt film 11, the SRO film 12, the SRO film 14 and the Pt film 15 shown in FIG. 2 are formed by the methods similar to those employed for forming the Pt film 11, the SRO film 12, the SRO film 14 and the Pt film 15 shown in FIG. 1. However, the annealing method employed for forming the PZT film 13 shown in FIG. 2 differs from the method employed for forming the PZT film 13 shown in FIG. 1. The deposition and the annealing process of the amorphous PZT film are repeated twice in the comparative case shown in FIG. 2, too. In the comparative case, however, the annealing process (RTA treatment) is performed each time at 550 to 600° C. for 30 seconds in an oxygen gas atmosphere.

Figure 3:
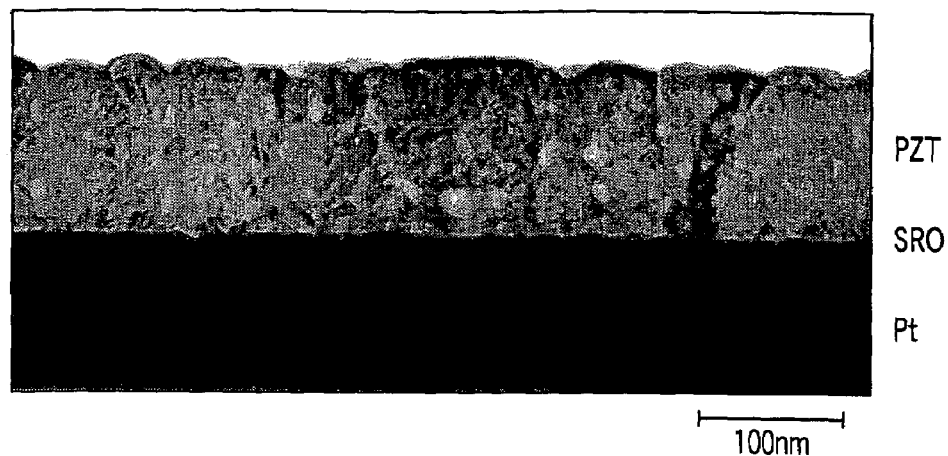
FIG. 3 is a TEM image showing the cross sectional structure of the capacitor according to the first embodiment of the present invention.

FIG. 3 shows a cross sectional structure of the capacitor according to the first embodiment of the present invention shown in FIG. 1, which was observed by TEM (Transmission Electron Microscopy). Shown in FIG. 3 is the structure before formation of the top electrode including an SRO film and a Pt film.

In the PZT film 13a obtained by the annealing method according to the first embodiment of the present invention, the crystal grain is shaped conical or oval. To be more specific, a cross section of the crystal grain is wedge-shaped or shaped elliptical as shown in FIGS. 1 and 3. Because of the particular shape of the crystal grains, the directions of the grain boundaries are not aligned, i.e., the grain boundaries have a plurality of directions, and the directions of the grain boundaries are arranged at random. In other words, the grain boundaries are shaped zigzag between the lower surface and the upper surface of the PZT film. On the other hand, the crystal grains are shaped columnar in the PZT film 13b, as in the PZT film 13 for the comparative case shown in FIG. 2.

Figure 4:
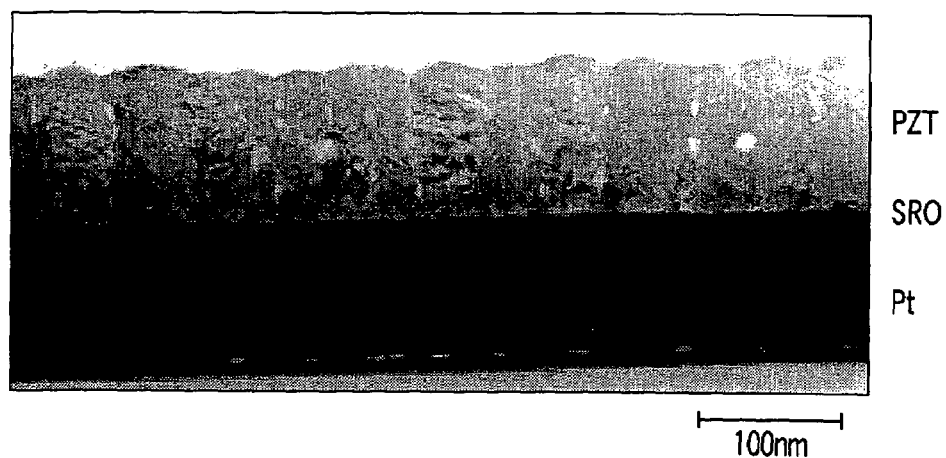
FIG. 4 is a TEM image showing the cross sectional structure of the capacitor for the comparative example (conventional case)

FIG. 4 shows a cross sectional structure of the capacitor for the comparative case shown in FIG. 2, which was observed by the TEM. In the comparative case, the crystal grains of the PZT film are shaped columnar and have an oblong (rectangular) cross sectional shape. Also, the grain boundaries are aligned and extend in a direction substantially perpendicular to the lower surface and the upper surface of the PZT film. In other words, the grain boundaries extend in one direction.

The electrical characteristics of the ferroelectric capacitor will now be described in respect of the capacitor according to the first embodiment of the present invention and the capacitor for the comparative case.

Figure 5:
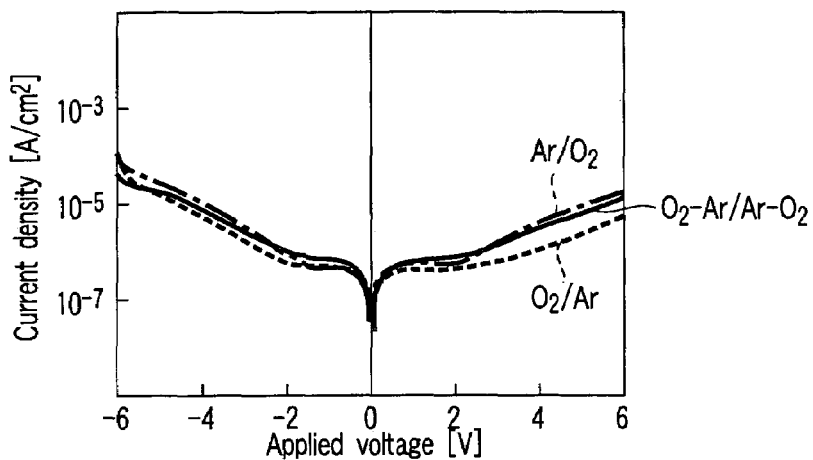
FIG. 5 shows I-V characteristics of the capacitors according to the embodiments of the present invention.
Figure 6:
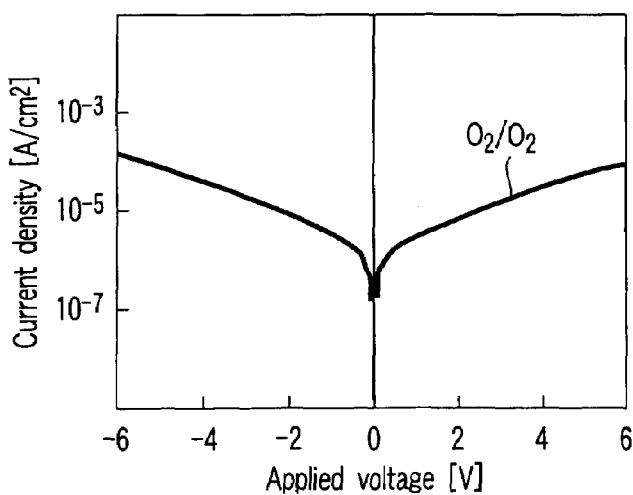
FIG. 6 shows I-V characteristics of the capacitors for the comparative example (conventional case)

FIGS. 5 and 6 are graphs each showing the result of measurement of the leakage current characteristics (I-V characteristics). A curve ($O_2$—Ar/Ar—$O_2$) shown in FIG. 5 denotes the characteristics of the capacitor according to the first embodiment of the present invention, and FIG. 6 shows the characteristics of the capacitor for the comparative case (conventional case). In the comparative case shown in FIG. 6, the leakage current density is as high as $8.3 \times 10^{-6}$ A/cm$^2$ at the voltage of +2.5V. In the capacitor according to the first embodiment of the present invention, however, the leakage current density is as low as $5.9 \times 10^{-7}$ A/cm$^2$ at the voltage of +2.5V, supporting that the first embodiment permits markedly improving the leakage current characteristics.

Figure 7:
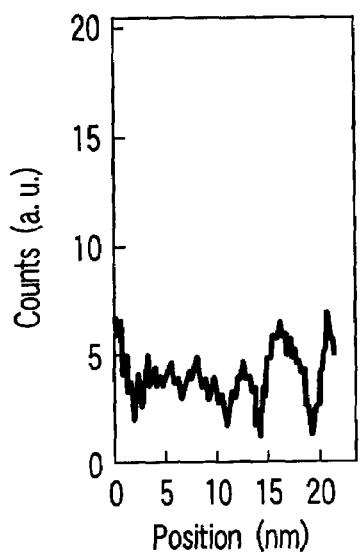
FIG. 7 relates to an embodiment of the present invention and shows the result of analysis of Ru contained in a PZT film, the analysis being performed by using a TEM-EDX.
Figure 8:
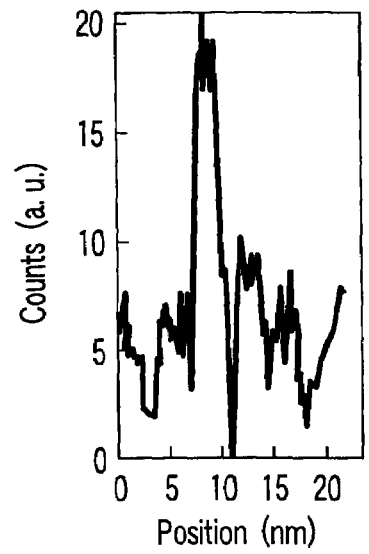
FIG. 8 relates to a comparative example (conventional case) and shows the result of analysis of Ru contained in a PZT film, the analysis being performed by using a TEM-EDX.

In order to investigate the reasons for the experimental data given in FIGS. 5 and 6, the elements present in the grain boundaries of the PZT film were analyzed by a TEM-EDX. FIG. 7 shows the result in respect of the capacitor according to the first embodiment of the present invention, and FIG. 8 shows the result in respect of the capacitor for the comparative case. In the comparative case shown in FIG. 8, prominent peak for Ru is strongly detected in the grain boundaries of the PZT film. In the capacitor according to the first embodiment of the present invention, however, a prominent peak for Ru is not observed in the PZT film. One of the reasons for the phenomenon is that, since the first embodiment of the present invention differs from the comparative case in the shape of the crystal grain, as shown in FIGS. 3 and 4, the Ru diffusion vertical to the interface between PZT film and SRO film has been changed. To be more specific, it is considered reasonable to understand that, since the grain boundary is shaped zigzag in the first embodiment of the present invention, the effective diffusing length is rendered long, which suppresses the diffusion of Ru toward the surface of PZT film.

Figure 9:
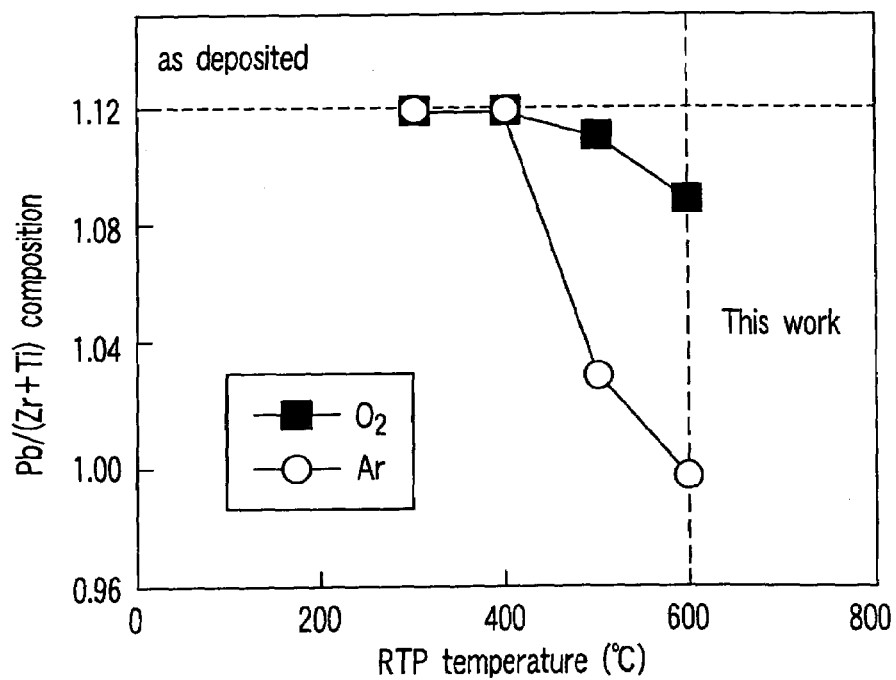
FIG. 9 shows the result of an ICP analysis in respect of the dependence on temperature of the Pb amount contained in a capacitor.

Another reason is considered to be as follows. FIG. 9 shows the result of the ICP analysis in respect of the dependence on temperature of the Pb amount. The ICP analysis was conducted by changing the type of RTA gas. As shown in FIG. 9, in the case of the RTA carried out in an oxygen gas atmosphere, the Pb decreasing amount is small at temperatures falling within a range of between 300° C. and 700° C. In the case of the RTA carried out in an Ar gas atmosphere, however, the Pb amount is rapidly decreased in the vicinity of the crystallizing temperature, resulting in reaching a Pb content close to the stoichiometric value. The experimental data given above support that, in the comparative case, a large amount of Pb or Pb compounds remain in the grain boundaries of the PZT film, and Ru is diffused and makes a reaction to form a conductive oxide represented by the chemical formula $Pb_2Ru_2O_{7-x}$. The conductive oxide thus formed is regarded as the cause of a leakage path.

It is considered reasonable to understand that the first embodiment of the present invention was rendered different from the comparative case in the leakage current characteristics under the situation described above. To reiterate, in the first embodiment of the present invention, the grain boundaries are shaped zigzag, resulting in suppressing the Ru diffusion vertical to the interface between PZT film and SRO film. Also, the Pb amount in PZT film is decreased by the RTA carried out in an Ar gas atmosphere. Such being the situation, it is considered reasonable to understand that the formation of the conductive oxide referred to above is suppressed to lower the leakage current.

FIG. 10 is a graph showing the result of measurement of the fatigue characteristics. In measuring the fatigue characteristics, the driving voltage at the switching polarization was set at ±6 V, the pulse width was set at 10μsecond, and the applied voltage in measuring the polarization was set at ±4 V. In the comparative case ($O_2/O_2$), the amount of the remanent polarization begins to be decreased in the vicinity of $10^5$ to $10^6$ switching cycles. On the other hand, in the case of the first embodiment of the present invention ($O_2$—Ar/Ar—$O_2$), the amount of the remanent polarization is not decreased even after $10^{10}$ cycles of the polarization switching. It is considered reasonable to understand that, in the first embodiment of the present invention, the film is densified and the Pb amount is rendered optimum so as to produce the excellent effect described above.

FIG. 11 is a graph showing the result of the measurement of the imprint characteristics. After the heating at 150° C. for 600 hours or more, the voltage shift relative to the initial value is decreased by about 0.1V in the first embodiment of the present invention ($O_2$—Ar/Ar—$O_2$), compared with the comparative case ($O_2/O_2$), supporting that good imprint characteristics can be obtained in the first embodiment of the present invention.

As described above, in the first embodiment of the present invention, the amorphous PZT film is annealed in an Ar gas atmosphere, with the result that, in the crystallized PZT film after the annealing treatment, it is possible to obtain dense and fine crystal grains, and the grain boundaries are rendered zigzag. Also, it is possible to control the Pb amount in the grain boundaries and in the interface. As a result, the amount of Pb contained in the PZT film is decreased, and the diffusion of Ru contained in the electrode is suppressed so as to make it possible to markedly suppress the leakage current. In addition, the ratio of Pb in the interface between the PZT film and the electrode is made optimum so as to make it possible to improve the reliability of the capacitor. For example, it is possible to improve the fatigue characteristics.

Second Embodiment

Figure 12:
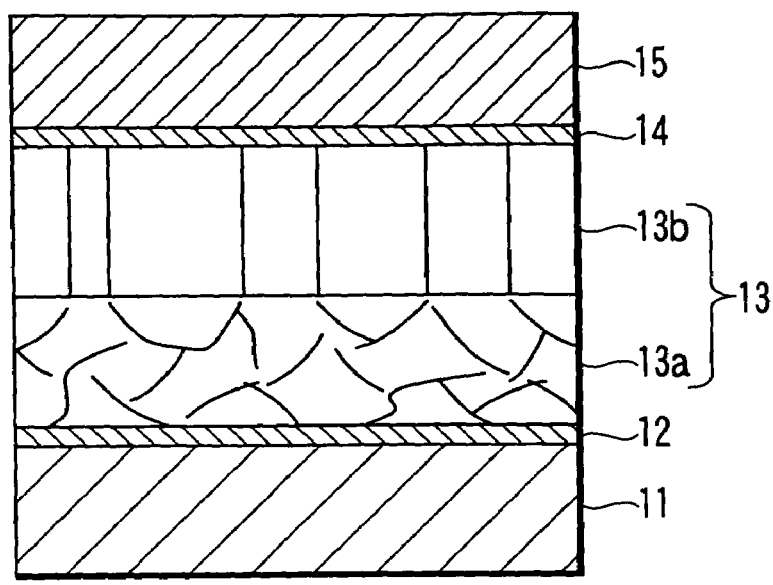
FIG. 12 is a cross sectional view schematically showing the structure of a capacitor according to a second embodiment of the present invention.

FIG. 12 schematically shows the structure of a capacitor included in a semiconductor device according to a second embodiment of the present invention. The capacitor shown in FIG. 12 is substantially equal in the basic structure to the capacitor according to the first embodiment of the present invention shown in FIG. 1, except that the second embodiment differs from the first embodiment in the structure of the PZT film.

A method of preparing the capacitor shown in FIG. 12 will now be described. Incidentally, the second embodiment shown in FIG. 12 is substantially equal to the first embodiment shown in FIG. 1 in the structures and the methods of forming the Pt film 11, the SRO film 12, the SRO film 14 and the Pt film 15. Such being the situation, the method of forming the PZT films 13a and 13b will now be described.

Each of the deposition and annealing processes of the amorphous PZT film is repeated twice in the second embodiment, too, as in the first embodiment of the present invention. The second embodiment is equal to the first embodiment in the film-forming conditions, etc. for forming the amorphous PZT film, but differs from the first embodiment in the annealing process (RTA process). Specifically, in the second embodiment of the present invention, the first layer amorphous PZT film is deposited first, followed by annealing the deposited amorphous PZT film in an Ar gas atmosphere so as to form the first layer PZT film 13a. On the other hand, the second layer amorphous PZT film is deposited first on the first layer PZT film 13a, followed by annealing the deposited amorphous PZT film in an oxygen gas atmosphere so as to form the second layer PZT film 13b. In each of these annealing steps, the annealing temperature is set at 550 to 600° C., and the annealing treatment is carried out for 30 seconds.

Because of the method described above, the first layer PZT film 13a for the second embodiment is rendered equal in structure to the PZT film 13a for the first embodiment shown in FIG. 1. On the other hand, the second layer PZT film 13b for the second embodiment is rendered equal in structure to the PZT film 13 for the comparative case shown in FIG. 2.

The electric characteristics of the ferroelectric capacitor will now be described in respect of the second embodiment of the present invention.

FIG. 5 referred to previously also shows the result of the measurement in respect of the leakage current characteristics (1-V characteristics). In the second embodiment of the present invention ($Ar/O_2$), the leakage current density is as low as about $6.5 \times 10^{-7}$ A/$cm^2$ at the voltage of +2.5V, supporting a marked improvement in the leakage current characteristics. The effect described previously in conjunction with the first embodiment of the present invention is considered to contribute to the improvement in the leakage current characteristics achieved in the second embodiment of the present invention.

FIG. 10 referred to previously also shows the result of the measurement in respect of the fatigue characteristics for the second embodiment of the present invention. In measuring the fatigue characteristics, the driving voltage at the switching polarization was set at ±6 V, the pulse width was set at 10μ seconds, and the applied voltage in measuring the polarization was set at ±4 V. In the second embodiment of the present invention ($Ar/O_2$), the amount of the remanent polarization is not decreased even after $10^{10}$ cycles of the polarization switching. FIG. 10 also shows the result of the measurement, covering the case where the process of forming the first layer PZT film and the process of forming the second layer PZT film were reversed in respect of the annealing atmosphere, i.e., the case where the first layer PZT film was annealed in an oxygen gas atmosphere and the second layer PZT film was annealed in an Ar gas atmosphere ($O_2/Ar$). In this case, deterioration of switching endurance is brought about to some extent. It is considered reasonable to understand that, since the amount of oxygen is rendered insufficient in a region in the vicinity of the upper surface of the second layer PZT film because of the RTA treatment carried out in an Ar gas atmosphere, oxygen atoms contained in the SRO film were extracted by the PZT film, which lowers the crystallinity of the SRO film, thereby bringing about the deterioration referred to above. However, even in the case of the $O_2/Ar$ in respect of the annealing atmosphere, the second layer PZT film is rendered equal in structure to the PZT film 13a in the first embodiment of the present invention shown in FIG. 1, which makes it possible to improve the characteristics of the capacitor.

FIG. 11 referred to previously also shows the result of measurement of the imprint characteristics for the second embodiment of the present invention. Specifically, after the heating at 150° C. for 600 hours or more, the voltage shift relative to the initial value is decreased by about 0.1V in the second embodiment of the present invention ($Ar/O_2$), compared with the comparative case ($O_2/O_2$), supporting that good imprint characteristics can be obtained in the second embodiment of the present invention.

As described above, the second embodiment of the present invention also makes it possible to suppress the high leakage current and to improve the ferroelectricity and the reliability of the capacitor, like the first embodiment of the present invention described previously.

Third Embodiment

Figure 13:
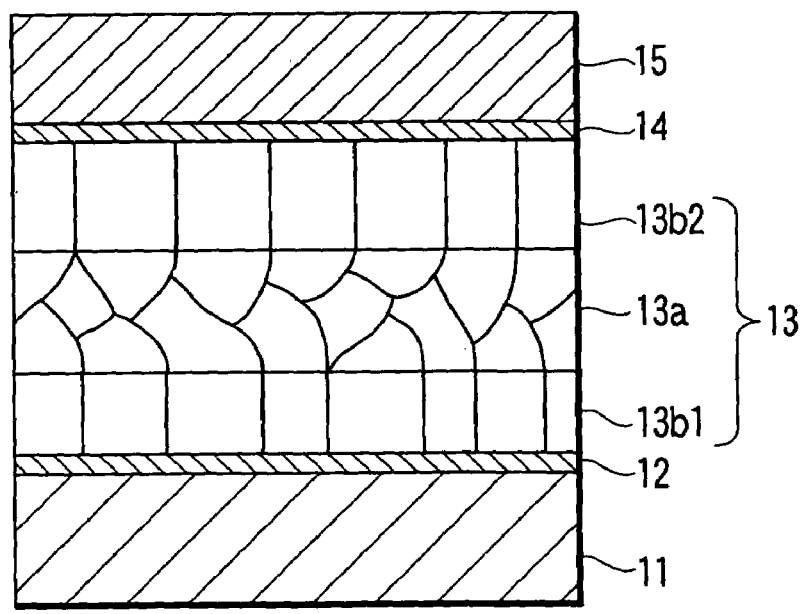
FIG. 13 is a cross sectional view schematically showing the structure of a capacitor according to a third embodiment of the present invention.

FIG. 13 schematically shows the structure of a capacitor included in a semiconductor device according to a third embodiment of the present invention. The capacitor according to the third embodiment of the present invention is substantially equal in the basic structure to the capacitor according to the first embodiment of the present invention shown in FIG. 1, except that the third embodiment differs from the first embodiment in the structure of the PZT film.

A method of preparing the capacitor shown in FIG. 13 will now be described. Incidentally, the structures and the forming methods of the Pt film 11, the SRO film 12, the SRO film 14 and the Pt film 15 shown in FIG. 13 are equal to those for the first embodiment of the present invention. Such being the situation, the method of forming the PZT films 13a, 13b1 and 13b2 will now be described.

In the third embodiment of the present invention, the steps of depositing and annealing the amorphous PZT film are repeated three times. The third embodiment is equal to the first embodiment in the film-forming conditions, etc. of the amorphous PZT film. However, the time for forming each amorphous PZT film was set at 48 seconds in the third embodiment so as to make the total thickness of the PZT film equal to that in the first embodiment. Specifically, in the third embodiment of the present invention, the first layer amorphous PZT film is deposited first, followed by annealing the deposited amorphous PZT film in an oxygen gas atmosphere so as to form the first layer PZT film 13b1. Then, the second layer amorphous PZT film is deposited first on the first layer PZT film 13b1, followed by annealing the deposited amorphous PZT film in an Ar gas atmosphere so as to form the second layer PZT film 13a. Further, the third layer amorphous PZT film is deposited first on the second layer PZT film 13a, followed by annealing the deposited amorphous PZT film in an oxygen gas atmosphere so as to form the third layer PZT film 13b2. In each of these annealing steps, the annealing temperature is set at 550 to 600° C., and the annealing treatment is carried out for 20 seconds.

Because of the method described above, the second layer PZT film 13a is rendered equal in structure to the PZT film 13a for the first embodiment of the present invention shown in FIG. 1. Also, each of the first layer PZT film 13b1 and the third layer PZT film 13b2 is rendered equal in structure to the PZT film 13 for the comparative case shown in FIG. 2.

As described above, the third embodiment of the present invention also makes it possible to suppress the high leakage current, to improve the fatigue characteristics, and to improve the characteristics and the reliability of the capacitor, like the first embodiment of the present invention described previously.

In the third embodiment of the present invention described above, the process of depositing and annealing the amorphous PZT film is repeated three times. Alternatively, it is also possible to deposit first an amorphous PZT film, followed by successively applying an annealing treatment in an oxygen gas atmosphere, an annealing treatment in an Ar gas atmosphere and, then, an annealing treatment in an oxygen atmosphere to the amorphous PZT film. It is possible to obtain the structure shown in FIG. 13 in this case, too. It is also possible to obtain the structure as shown in FIG. 13 by changing, for example, the annealing conditions even in the case of employing the process employed in the first embodiment of the present invention described previously.

Each of the embodiments described above does not comprise the BEOL (Back End Of the Line) process, such as forming a contact, a wiring and an interlayer film, etching, and polishing for planarization. However, it is possible to obtain the effects described above even in the case of employing the full process. Also, in each of the embodiments described above, the amorphous PZT film, etc. was formed by the sputtering method. However, it is of course possible to employ another film-forming technique.

Also, in the case of manufacturing a memory device having a COP (Capacitor On Plug) structure by using, for example, polycrystalline silicon (polysilicon) or tungsten as the plug material, it is possible to suppress the diffusion of oxidizing agent to the plug surface by employing the method for each of the embodiments described above, which makes it possible to realize a semiconductor memory device of a larger scale of integration.

Further, in each of the embodiments described above, it is desirable for the annealing temperature T1 for annealing the lower layer side SRO film 12, the annealing temperature T2 for annealing the PZT film 13, and the annealing temperature T3 for annealing the upper layer side SRO film 14 to have the relationship of: $T1 \geq T2 \geq T3$. Also, concerning the PZT film 13, it is desirable for the annealing temperature for annealing the upper layer side not to be higher than the annealing temperature for annealing the lower layer side.

Still further, in each of the embodiments described above, it is possible to use a He gas, a Ne gas, a Kr gas, a Xe gas, a Rn gas or a nitrogen gas as an inert gas in place of the Ar gas for carrying out the annealing treatment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
    forming a bottom electrode above a semiconductor substrate;
    forming a lower dielectric film, which is made of perovskite type ferroelectrics containing Pb, Zr, Ti and O, on the bottom electrode;
    annealing the lower dielectric film in an oxygen gas atmosphere;
    forming an upper dielectric film, which is made of perovskite type ferroelectrics containing Pb, Zr, Ti and O, on the lower dielectric film;
    annealing the upper dielectric film in an inert gas atmosphere; and
    forming a top electrode above the upper dielectric film.

2. The method of manufacturing a semiconductor device according to claim 1, wherein at least one of the bottom electrode and the top electrode includes a film containing Ru.

3. The method of manufacturing a semiconductor device according to claim 1, wherein the inert gas includes at least one of a He gas, a Ne gas, an Ar gas, a Kr gas, a Xe gas, a Rn gas, and a nitrogen gas.

4. The method of manufacturing a semiconductor device according to claim 1, further comprising:
    forming an additional dielectric film, which is made of perovskite type ferroelectrics containing Pb, Zr, Ti and O, on the upper dielectric film; and
    annealing the additional dielectric film in an oxygen gas atmosphere.

* * * * *